United States Patent [19]

Sun et al.

[11] Patent Number: 5,479,362
[45] Date of Patent: Dec. 26, 1995

[54] DIGITAL BAND PASS ELLIPTIC FILTER SYSTEM

[75] Inventors: Weimin Sun, Nara; Shigeki Kajimoto, Sakai, both of Japan

[73] Assignee: Icom Incorporated, Osaka, Japan

[21] Appl. No.: 322,795

[22] Filed: Oct. 13, 1994

[30] Foreign Application Priority Data

May 31, 1994 [JP] Japan .................................. 6-141041
Sep. 8, 1994 [JP] Japan .................................. 6-214546

[51] Int. Cl.$^6$ ....................................... G06F 17/10
[52] U.S. Cl. .............................. 364/724.01; 364/724.17; 364/724.2
[58] Field of Search ................... 364/724.01, 724.03, 364/724.06, 724.08, 724.09, 724.17, 724.2

[56] References Cited

U.S. PATENT DOCUMENTS

| | | | |
|---|---|---|---|
| 3,746,997 | 7/1973 | Willett et al. | 375/324 |
| 4,336,501 | 6/1982 | Ishikawa et al. | 330/109 |
| 4,479,257 | 10/1984 | Akiyama | 455/266 |
| 4,524,422 | 6/1985 | Kasuga | 364/724.2 |
| 4,858,225 | 8/1989 | deSantis | 370/95.3 |

FOREIGN PATENT DOCUMENTS 55-16573  2/1980  Japan.

*Primary Examiner*—Roy N. Envall, Jr.
*Assistant Examiner*—Chuong D. Ngo
*Attorney, Agent, or Firm*—Frishauf, Holtz, Goodman, Langer & Chick

[57] ABSTRACT

The filter coefficients of a digital band pass elliptic filter can be approximated to a linear function of the center frequency of the pass band width. The filter coefficients of a band pass digital filter having a predetermined center frequency and the slope of this linear function are stored in first and second memories. A central processing unit (CPU) obtains the difference between a desired center frequency and a predetermined center frequency. A multiplier multiplies the slope stored in the second memory by the difference obtained by the CPU. An adder adds each of the filter coefficients stored in the first memory to an associated one of the products output from the multiplier. The adding results become the filter coefficients for obtaining the desired center frequency. Those filter coefficients are set in a digital filter.

2 Claims, 11 Drawing Sheets

DIGITAL BAND PASS ELLIPTIC FILTER SYSTEM

BACKGROUND OF THE INVENTION

1. Field of the Invention

The present invention relates to a digital filter, and, more particularly, to a digital band pass elliptic filter capable of changing the center frequency of a pass band and/or the pass band width.

2. Description of the Related Art

Digital band pass filters are used in various technical fields.

For example, Japanese Unexamined Patent Publication No. 16573/1980 discloses an infinite impulse response (IIR) variable digital filter which can independently alter the center frequency of its pass band and the width of the pass band.

The IIR variable digital filter described in this publication changes the center frequency and the pass band width in the following manner.

First, with $P=j\Omega=j2\pi f$, the transfer function $H_L(P)$ of a low-pass filter (LPF) on the P plane is expressed by an equation (1) below.

$$H_L(P)=(a_0P^2+a_1P+a_2)/(P^2+b_1P+b_2) \quad (1)$$

The transfer function of the band pass filter can be obtained by transforming the transfer function $H_L(P)$ along the frequency axis according to the following equation (2).

$$P \rightarrow B_0(P+\Omega_o^2/P) \quad (2)$$

where $B_0$ is the pass band width and $\Omega_o$ is the center frequency.

From the equations (1) and (2), the transfer function $H_B(P)$ of the band pass filter becomes as expressed by an equation (3).

$$H_B(P)=\frac{\alpha_0 B_0^2\left(P+\frac{\Omega_0^2}{P}\right)^2+\alpha_1 B_0\left(P+\frac{\Omega_0^2}{P}\right)+\alpha_2}{B_0^2\left(P+\frac{\Omega_0^2}{P}\right)^2+b_1 B_0\left(P+\frac{\Omega_0^2}{P}\right)+b_2} \quad (3)$$

The transfer function on the Z plane, when acquired by the transformation given by the following equation (4), becomes as expressed by an equation (5) below.

$$P \rightarrow (1-Z^{-2})/(2Z^{-1}) \quad (4)$$

$$H(Z)=\frac{\alpha_0+\frac{\alpha_1}{B_0}\Phi(Z,\Omega_0^2)+\frac{\alpha_2}{B_0^2}\phi^2(Z,\Omega_0^2)}{1+\frac{b_1}{B_0}\Phi(Z,\Omega_0^2)+\frac{b_2}{B_0^2}\Phi^2(Z,\Omega_0^2)} \quad (5)$$

In the equation (5), $\Phi(Z, \Omega_o^2)/B_0$ is the function of the pass band width and center frequency of the filter. By acquiring $\Phi(Z, \Omega_o^2)/B_0$ from the desired (target) center frequency and the pass band width and substituting the result in the equation (5), the transfer function of the desired band pass filter can be obtained.

For the IIR variable digital filter disclosed in Japanese Unexamined Patent Publication No. 16573/1980, however, the value of the function $\Phi(Z, \Omega_o^2)/B_0$ should be obtained to alter the center frequency of the pass band and pass band width.

$\Phi(Z, \Omega_o^2)/B_0$ is a non-linear function of the center frequency and the pass band width and its computation is complex involving a vast amount of calculations, resulting in a long computation time and a large rounding error. Further, to store the transfer function and execute the computation, a large memory capacity is disadvantageously needed.

SUMMARY OF THE INVENTION

It is therefore an object of the present invention to provide a digital band pass elliptic filter which can alter the center frequency and/or pass band width with a less amount of computation and a smaller memory capacity.

To achieve the above object, according to one aspect of this invention, there is provided a center-frequency variable type digital band pass elliptic filter system comprising:

an N-order digital band pass elliptic filter for filtering an input digital signal in accordance with filter coefficients $\{a_{1i}, a_{2i}, b_{1i}\}$ ($i=1, 2, \ldots, N/2$; N being an even);

memory means for storing linear coefficients $k_{aji}$ and $k_{bli}$ computed according to following equations, using filter coefficients $\{a_{1i}(f_a), a_{2i}(f_a), b_{1i}(f_a)\}$ and $\{a_{1i}(f_b), a_{2i}(f_b), b_{1i}(f_b)\}$ of first and second known digital band pass elliptic filters having a same pass band width and pass band center frequencies $f_a$ and $f_b$, and filter coefficients $\{(a_{1i}(f_r), a_{2i}(f_r), b_{1i}(f_r)\}$ of a third known digital band pass elliptic filter having the same pass band width as that of the first and second known digital band pass elliptic filters and a pass band center frequency fr, $$k_{aji}=[a_{ji}(f_b)-a_{ji}(f_a)]/(f_b-f_a)$$

$i=1, 2, \ldots, N/2, j=1, 2$ $$k_{bli}=[b_{1i}(f_b)-b_{1i}(f_a)]/(f_b-f_a)$$

$i=1, 2, \ldots, N/2$;

shift-amount setting means for setting a shift amount $m\Delta f$ between a desired center frequency of the N-order digital band pass elliptic filter and a predetermined center frequency $f_r$;

multiplying means for multiplying the shift amount $m\Delta f$, supplied from the shift-amount setting means, by each of the linear coefficients $K_{aji}$ and $k_{bli}$ to yield $m\Delta f \cdot k_{aji}$ and $m\Delta f \cdot k_{bli}$;

adding means for adding each of products obtained by the multiplying means to an associated one of the filter coefficients stored in the memory means to obtain $a_{1i}(f_r) \ m\Delta f \cdot k_{a1i}$, $a_{2i}(f_r)+m\Delta f \cdot k_{a2i}$ and $b_{1i}(f_r)+m\Delta f \cdot k_{b1i}$; and setting means for setting values $a_{1i}(f_r)+m\Delta f \cdot k_{a1i}$, $a_{2i}(f_r)+m\Delta f \cdot k_{a2i}$ and $b_{1i}(f_r)+m\Delta f \cdot k_{b1i}$ obtained by the adding means as the filter coefficients $\{a_{1i}, a_{2i}, b_{1i}\}$ of the N-order digital band pass elliptic filter, thereby setting a center frequency of the N-order digital band pass elliptic filter to $f_r+m\Delta f$.

As the predetermined center frequency $f_r$, the center frequencies $f_a$ and $f_b$ of known digital band pass elliptic filters may be used.

According to another aspect of this invention, there is provided a band-width variable type digital band pass elliptic filter system comprising:

an N-order digital band pass elliptic filter for filtering an input digital signal in accordance with filter coefficients $\{a_{1i}, a_{2i}, b_{1i}\}$ ($i=1, 2, \ldots, N/2$; N being an even);

memory means for storing linear coefficients $k_{aji}$ and $k_{b1i}$ computed according to following equations, using filter coefficients $\{a_{1i}(B_a), a_{2i}(B_a), b_{1i}(B_a)\}$ and $\{a_{1i}(B_b), a_{2i}(B_b), b_{1i}(B_b)\}$ of first and second known digital band pass elliptic filters having a same center frequency and pass band widths $B_a$ and $B_b$, and filter coefficients $\{a_{1i}(B_r), a_{2i}(B_r), b_{1i}(B_r)\}$ of a third known digital band pass elliptic filter having the same center frequency as that of the first and second known digital band pass elliptic filters and a pass band width $B_r$, $$k_{aji}=[a_{ji}(B_b)-a_{ji}(B_a)]/(B_b-B_a)$$

$i=1, 2, \ldots, N/2, j=1, 2$ $$k_{b1i}=[b_{1i}(B_b)-b_{1i}(B_a)]/(B_b-B_a)$$

$i=1, 2, \ldots, N/2$;

shift-amount setting means for setting a shift amount $m\Delta B$ between a desired pass band width of the N-order digital band pass elliptic filter and a predetermined pass band width $B_r$;

multiplying means for multiplying the shift amount $m\Delta B$, supplied from the shift-amount setting means, by each of the linear coefficients $K_{aji}$ and $k_{b1i}$ to yield $m\Delta B \cdot k_{aji}$ and $m\Delta B \cdot k_{b1i}$;

adding means for adding each of products obtained by the multiplying means to an associated one of the filter coefficients stored in the memory means to obtain $a_{1i}(B_r)+m\Delta B \cdot k_{a1i}$, $a_{2i}(B_r)+m\Delta B \cdot k_{a2i}$ and $b_{1i}(B_r)+m\Delta B \cdot k_{b1i}$; and setting means for setting values $a_{1i}(B_r)+m\Delta B \cdot k_{a1i}$, $a_{2i}(B_r)+m\Delta B \cdot k_{a2i}$ and $b_{1i}(B_r)+m\Delta B \cdot k_{b1i}$ obtained by the adding means as the filter coefficients $\{a_{1i}, a_{2i}, b_{1i}\}$ of the N-order digital band pass elliptic filter, thereby setting a pass band width of the N-order digital band pass elliptic filter to $B_r+m\Delta B$.

As the predetermined pass band width $B_r$, the pass band widths $B_a$ and $B_b$ of known digital band pass elliptic filters may be used.

The filter coefficients $\{a_{1i}, a_{2i}, b_{1i}\}$ of an N-order digital band pass elliptic filter can be substantially approximated by linear functions of the center frequency and pass band width. With the above-described structures, therefore, filter coefficients, when the desired center frequency or desired pass band width is obtained, can be acquired with a smaller amount of computation.

DETAILED DESCRIPTION OF THE PREFERRED EMBODIMENTS

The structure of a digital band pass elliptic filter system according to preferred embodiments of the present invention will be described below with reference to the accompanying drawings. In the following description, a frequency is expressed in the form of normalized one.

First Embodiment

First, an N-order IIR digital band pass elliptic filter system of a center-frequency variable type according to the first embodiment will be discussed from the theoretical aspect, and then its specific circuit structure will be explained.

Figure 1:
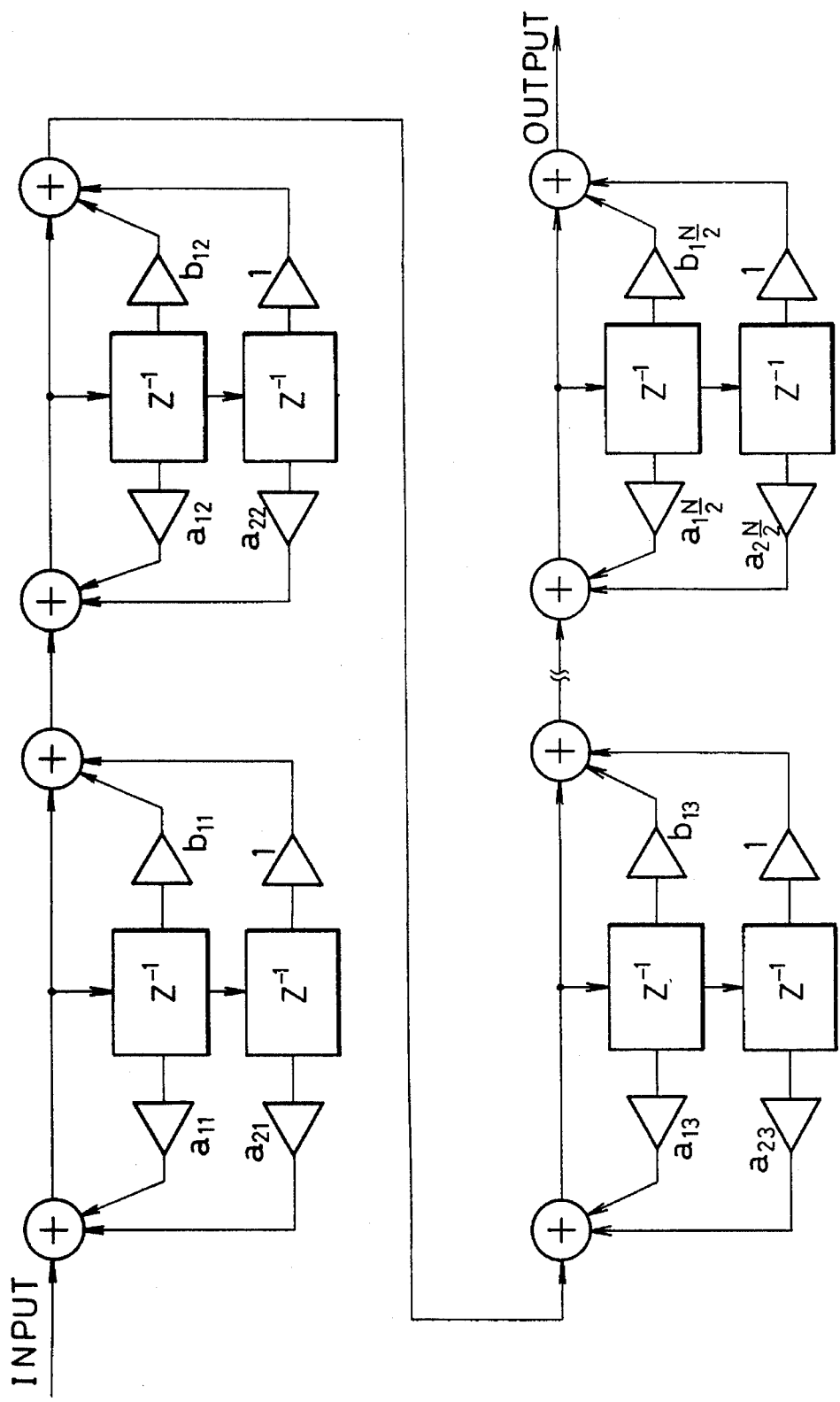
FIG. 1 is a diagram illustrating the basic structure of an N-order IIR digital band pass elliptic filter.

FIG. 1 illustrates an example of an N-order IIR digital band pass elliptic filter having N/2 two-order IIR filter sections connected in a cascade form. For the digital band pass elliptic filter having the structure shown in FIG. 1, a filter coefficient $b_{21}$ is almost "1."

Thus, its transfer function is approximately expressed by an equation (6).

$$H(\omega) = \prod_{i=1}^{N/2} \frac{1 + b_{1i}e^{-j\omega t} + e^{-2j\omega t}}{1 + \alpha_{1i}e^{-j\omega t} + \alpha_{2i}e^{-2j\omega t}} \quad (6)$$

Given that the pass band width (the width of the pass band) is constant, individual filter coefficients $a_{1i}$, $a_{2i}$ and $b_{1i}$ in the equation (6) approximately become linear functions of a normalized center frequency of the pass band (center frequency of the pass band with the sampling frequency taken as "1").

Thus, the transfer function in the equation (6) can be rewritten as an equation (7).

$$H(\omega) = \prod_{i=1}^{N/2} \frac{1 + b_{1i}(f_c)e^{-j\omega t} + e^{-2j\omega t}}{1 + \alpha_{1i}(f_c)e^{-j\omega t} + \alpha_{2i}(f_c)e^{-2j\omega t}} \quad (7)$$

where $f_c$ is the normalized center frequency ($0<f_c<0.5$) of the pass band, i.e., the center frequency with the sampling frequency taken as "1," and $a_{1i}(f_c)$, $a_{2i}(f_c)$ and $b_{1i}(f_c)$ indicate that the filter coefficients $a_{1i}$, $a_{2i}$ and $b_{1i}$ are linear functions of the normalized center frequency $f_c$.

If the pass band width of this band pass digital filter is $\Delta f_B$ and the normalized center frequency $f_c$ changes from $f_1$ to $f_2$, $0<f_1<f_2<0.5$, $0<f_1-\Delta f_B/2$, and $f_2+\Delta f_B/2<0.5$ are satisfied.

As the filter coefficients $a_{1i}(f_c)$, $a_{2i}(f_c)$ and $b_{1i}(f_c)$ are linear functions of the center frequency $f_c$, the values of the filter coefficients change in accordance with the amount of a change in center frequency $f_c$. Therefore, if the amount of a change in each filter coefficient with respect to a unit amount of a change $\Delta f$ of the center frequency $f_c$ (=the slope of a linear function of each filter coefficient) is obtained previously and the slope is multiplied by the amount of a change (shift amount) from the reference value of the center frequency $f_c$, it is possible to acquire the amount of a change in each filter coefficient for changing the center frequency $f_c$ from the reference value. By adding the acquired change amount to the filter coefficients when the reference value of the center frequency $f_c$ is obtained, filter coefficients necessary for attaining an arbitrary center frequency $f_c$ can be obtained.

According to this embodiment, therefore, the slope of the linear equation of each filter coefficient is obtained using the filter coefficients of arbitrary two known N-order IIR band pass digital filters. For example, provided that the two filters respectively having the center frequencies $f_a$ and $f_b$ (=$f_a$+ $n\Delta f$) have filter coefficients $\{a_{1i}(f_a), a_{2i}(f_a), b_{1i}(f_a)\}$ and $\{a_{1i}(f_b), a_{2i}(f_b), b_{1i}(f_b)\}$, the slopes of the linear equations can be obtained from equations (8) to (10).

$$k_{a1i}=[a_{1i}(f_b)-a_{1i}(f_a)]/(f_b-f_a) \quad (8)$$

$i=1, 2, \ldots, N/2$ $$k_{a2i}=[a_{2i}(f_b)-a_{2i}(f_a)]/(f_b-f_a) \quad (9)$$

$i=1, 2, \ldots, N/2$ $$k_{b1i}=[b_{1i}(f_b)-b_{1i}(f_a)]/(f_b-f_a) \quad (10)$$

$i=1, 2, \ldots, N/2$

The linear equations of the individual filter coefficients are obtained from equations (11) to (13) using the acquired slopes and the center frequency of another arbitrary known band pass digital filter, which has the same pass band width as the aforementioned two known band pass digital filters, e.g., a band pass digital filter having a center frequency $f_r$.

$$a_{1i}(f)=k_{a1i}\cdot(f-f_r)+a_{1i}(f_r) \quad (11)$$

$$a_{2i}(f)=k_{a2i}\cdot(f-f_r)+a_{2i}(f_r) \quad (12)$$

$$b_{1i}(f)=k_{b1i}\cdot(f-f_r)+b_{1i}(f_r) \quad (13)$$

where $f$ is the desired center frequency from which the individual filter coefficients can be obtained. By setting the obtained filter coefficients as new filter coefficients, the band pass digital filter having the desired center frequency is obtained.

If the center frequency $f_r$ is set equal to the aforementioned center frequency $f_a$ or $f_b$, for example, the filter coefficients used in the equation (8) to (10) can also be used.

With $f_r$=$f_a$, for instance, the equations (11) to (13) will be rewritten as equations (14) to (16), respectively.

$$a_{1i}(f)=k_{a1i}\cdot(f-f_a)+a_{1i}(f_a) \quad (14)$$

$$a_{2i}(f)=k_{a2i}\cdot(f-f_a)+a_{2i}(f_a) \quad (15)$$

$$b_{1i}(f)=k_{b1i}\cdot(f-f_a)+b_{1i}(f_a) \quad (16)$$

The structure of a digital filter system which can alter the center frequency using the above-described scheme will now be explained with reference to FIG. 2.

Figure 2:
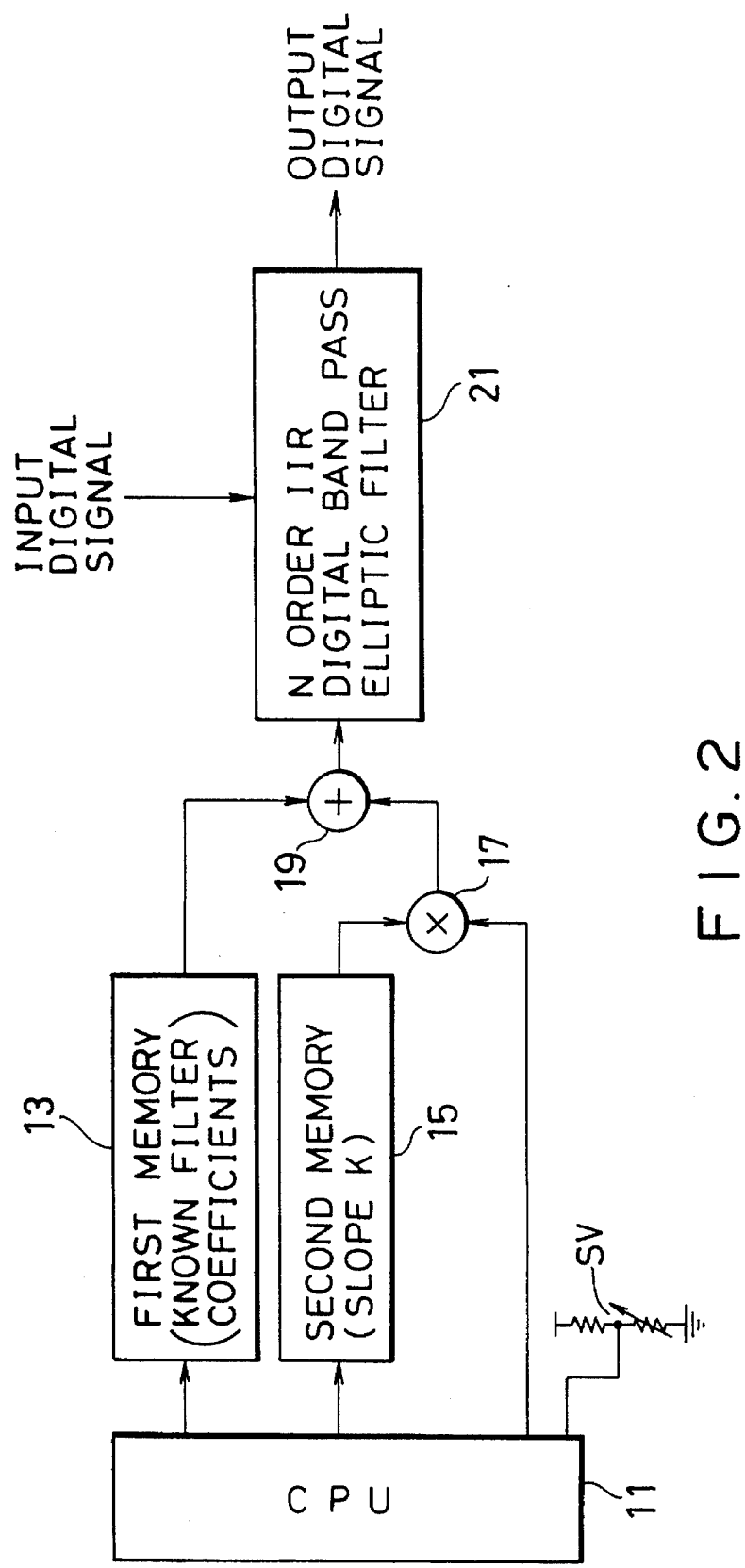
FIG. 2 is a block diagram showing the structure of a digital filter system embodying the present invention.

As shown in FIG. 2, this digital filter system comprises a CPU 11, a first memory 13, a second memory 15, a multiplier 17, an adder 19, an N-order IIR digital band pass elliptic filter 21, and a shift knob SV.

A user should manipulates a shift knob SV to instruct the desired center frequency of the pass band width of the digital filter system to the CPU 11.

The CPU 11 controls the general operation of this digital filter system and supplies the amount of a shift from the reference value of the center frequency (shift amount), $m\Delta f$, to the multiplier 17 in accordance with the instruction from the shift knob SV. The center frequency is changed in the units of $\Delta f$, m indicating the number of steps.

The first memory 13 stores the filter coefficients $\{a_{1i}(f_a), a_{2i}(f_a), b_{1i}(f_a)\}$ of the aforementioned arbitrary known digital band pass elliptic filters.

The second memory 15 stores the aforementioned slopes., $k_{a1i}$, $k_{a2i}$ and $k_{b1i}$ (i=1, 2, . . . , N/2).

The multiplier 17 obtains the products of the shift amount $m\Delta f$ of the pass band center frequency supplied from the CPU 11 and the slopes $k_{a1i}$, $k_{a2i}$ and $k_{b1i}$ stored in the second memory 15, $k_{a1i}\cdot m\Delta f$, $k_{a2i}\cdot m\Delta f$ and $k_{b1i}\cdot m\Delta f$, i.e., the change amounts of the filter coefficients due to a shift in center frequency.

The adder 19 adds each of the filter coefficients $a_{1i}(f_a)$, $a_{2i}(f_a)$, $b_{1i}(f_a)$ stored in the first memory 13, to an associated one of the multiplication results from the multiplier 17, $k_{a1i}\cdot m\Delta f$, $k_{a2i}\cdot m\Delta f$ and $k_{b1i}\cdot m\Delta f$, to attain new filter coefficients.

The digital band pass elliptic filter 21, which has a structure as shown in FIG. 1, for example, filters an input digital signal in accordance with the filter coefficients supplied from the adder 19. The digital signal supplied to the digital band pass elliptic filter may be obtained through A/D conversion of an analog acoustic signal at an arbitrary sampling period. A digital signal output from the digital band pass elliptic filter 21 is supplied to an analog circuit in the subsequent stage after being subjected to, for example, D/A conversion.

A specific description will now be given of an example of designing an eight-order center-frequency variable digital band pass elliptic filter which has a normalized pass band width of 0.025 with a unit change amount of the center frequency being 0.005.

Assume that the filter coefficients of known band pass digital filters FA and FB having a normalized pass band width of 0.025 take the following values.

For band pass digital filter FA,
normalized center frequency $f_{ca}$=0.275

$a_{11}$=0.1349, $a_{12}$=0.4758, $a_{13}$=0.2274, $a_{14}$=0.3692, $a_{21}$=0.9605, $a_{22}$=0.9616, $a_{23}$=0.9030, $a_{24}$=0.9041, $b_{11}$=−1.1288, $b_{12}$=−0.4022, $b_{13}$=−1.4847, $b_{14}$=−0.9559.

For band pass digital filter FB,
normalized center frequency $f_{cb}$=0.285

$a_{11}$=0.1962, $a_{12}$=0.5354, $a_{13}$=0.2868, $a_{14}$=0.4278, $a_{21}$=0.9604, $a_{22}$=0.9617, $a_{23}$=0.9029, $a_{24}$=0.9043, $b_{11}$=−1.0896, $b_{12}$=−0.3442, $b_{13}$=1.5159, $b_{14}$=1.0074.

In this case, the first memory 13 stores the individual filter coefficients of one of the band pass digital filters FA and FB, e.g., those of the filter FA.

The slopes of the linear functions of the individual filter coefficients are expressed as follows.

$$k_{a1i}=[a_{1i}(f_{cb})-a_{1i}(f_{ca})]/(f_{cb}-f_{ca})$$

$$k_{a2i}=[a_{2i}(f_{cb})-a_{2i}(f_{ca})]/(f_{cb}-f_{ca})$$

$$k_{b1i}=[b_{1i}(f_{cb})-b_{1i}(f_{ca})]/(f_{cb}-f_{ca})$$

$$f_{cb}-f_{ca}=0.01$$

The individual slopes take the following values.

$k_{a11}$=6.1300, $k_{a12}$=5.9600, $k_{a13}$=5.9400, $k_{a14}$=5.8600, $k_{a21}$=−0.0100, $k_{a22}$=0.0100, $k_{a23}$=0.0100, $k_{a24}$=0.0200, $k_{b11}=3.9200$, $k_{b12}=5.8000$, $k_{b13}=3.1200$, $k_{b14}=5.1500$.

Those values are stored in the second memory 15.

When the CPU 11 outputs the difference $m\Delta f$ ($=f-f_{ca}$) between the reference center frequency $f_{ca}$ and the desired center frequency f indicated by the shift knob SV, the multiplier 17 obtains the product of each slope and the frequency difference $m\Delta f$.

$k_{a11} \cdot m\Delta f = 6.1300 \cdot m\Delta f$, $k_{a12} \cdot m\Delta f = 5.9600 \cdot m\Delta f$, $k_{a13} \cdot m\Delta f = 5.9400 \cdot m\Delta f$, $k_{a14} \cdot m\Delta f = 5.8600 \cdot m\Delta f$, $k_{a21} \cdot m\Delta f = -0.0100 \cdot m\Delta f$, $k_{a22} \cdot m\Delta f = 0.0100 \cdot m\Delta f$, $k_{a23} \cdot m\Delta f = -0.0100 \cdot m\Delta f$, $k_{a24} \cdot m\Delta f = 0.0200 \cdot m\Delta f$, $k_{b11} \cdot m\Delta f = 3.9200 \cdot m\Delta f$, $k_{b12} \cdot m\Delta f = 5.8000 \cdot m\Delta f$, $k_{b13} \cdot m\Delta f = 3.1200 \cdot m\Delta f$, $k_{b14} \cdot m\Delta f = 5.1500 \cdot m\Delta f$.

Upon reception of the multiplication results from the multiplier 17, the adder 19 adds each of the filter coefficients stored in the first memory 13 to an associated one of the received products to yield new filter coefficients.

$a_{11}'=k_{a11} \cdot m\Delta f + a_{11}(f_{ca}) = 6.1300 \cdot m\Delta f + 0.1349$, $a_{12}'=k_{a12} \cdot m\Delta f + a_{12}(f_{ca}) = 5.9600 \cdot m\Delta f + 0.4758$, $a_{13}'=k_{a13} \cdot m\Delta f + a_{13}(f_{ca}) = 5.9400 \cdot m\Delta f + 0.2274$, $a_{14}'=k_{a14} \cdot m\Delta f + a_{14}(f_{ca}) = 5.8600 \cdot m\Delta f + 0.3692$, $a_{21}'=k_{a21} \cdot m\Delta f + a_{21}(f_{ca}) = -0.0100 \cdot m\Delta f + 0.9605$, $a_{22}'=k_{a22} \cdot m\Delta f + a_{22}(f_{ca}) = 0.0100 \cdot m\Delta f + 0.9616$, $a_{23}'=k_{a23} \cdot m\Delta f + a_{23}(f_{ca}) = -0.0100 \cdot m\Delta f + 0.9030$, $a_{24}'=k_{a24} \cdot m\Delta f + a_{24}(f_{ca}) = 0.0200 \cdot m\Delta f + 0.9041$, $b_{11}'=k_{b11} \cdot m\Delta f + b_{11}(f_{ca}) = 3.9200 \cdot m\Delta f - 1.1288$, $b_{12}'=k_{b12} \cdot m\Delta f + b_{12}(f_{ca}) = 5.8000 \cdot m\Delta f - 0.4022$, $b_{13}'=k_{b13} \cdot m\Delta f + b_{13}(f_{ca}) = 3.1200 \cdot m\Delta f + 1.4847$, $b_{14}'=k_{b14} \cdot m\Delta f + b_{14}(f_{ca}) = 5.1500 \cdot m\Delta f + 0.9559$.

The digital band pass elliptic filter 21 receives the filter coefficients $a_{11}'$, $a_{12}'$, $a_{13}'$, $a_{14}'$, $a_{21}'$, $a_{22}'$, $a_{23}'$, $a_{24}'$, $b_{11}'$, $b_{12}'$, $b_{13}'$, and $b_{14}'$ from the adder 19, and sets them as new filter coefficients therein, and filters the input digital signal in accordance with the received filter coefficients and outputs the filtered digital signal.

Figure 3:
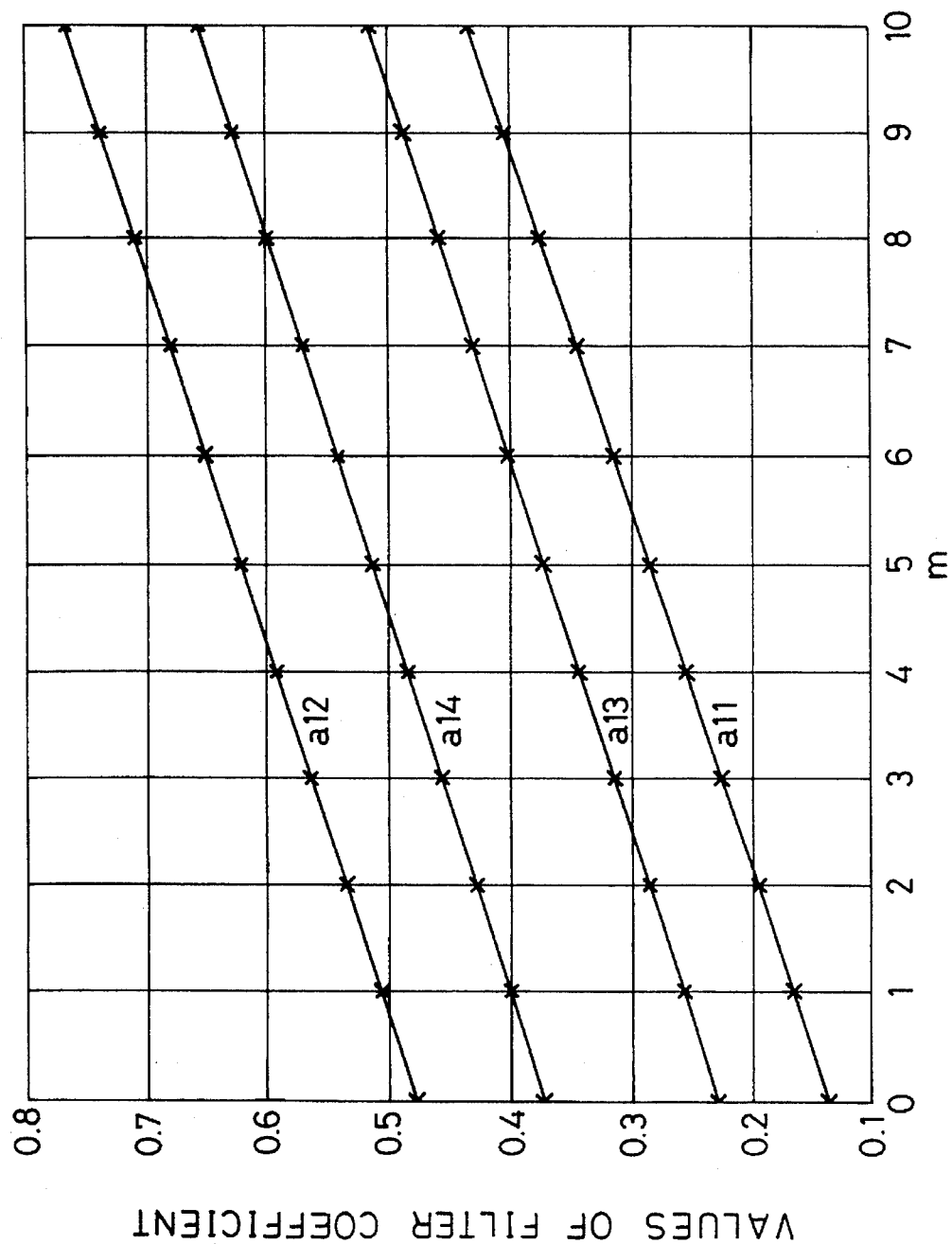
FIGS. 3 to 5 are graphs of linear functions of filter coefficients of a digital filter system according to a first embodiment of this invention.
Figure 4:
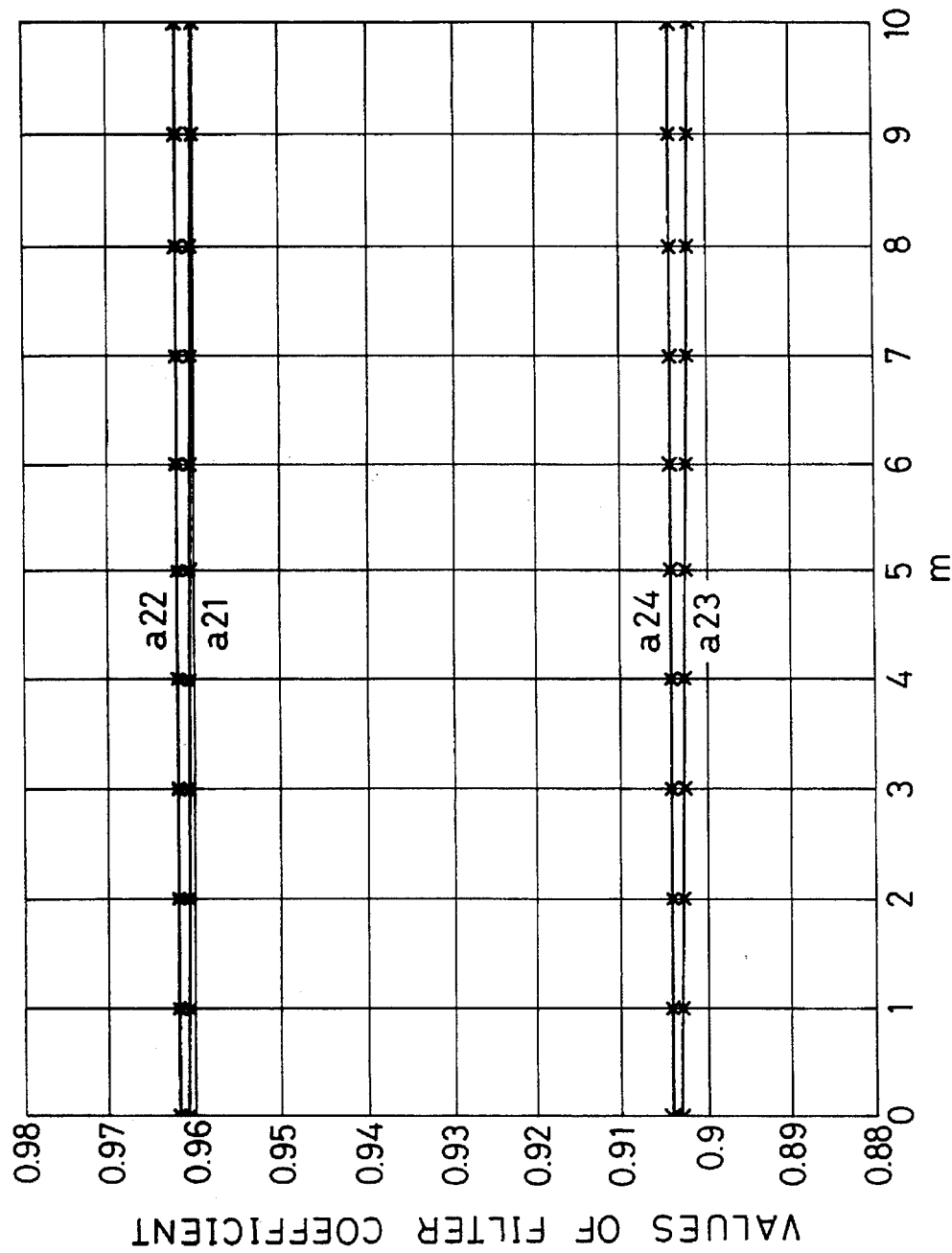
Figure 5:
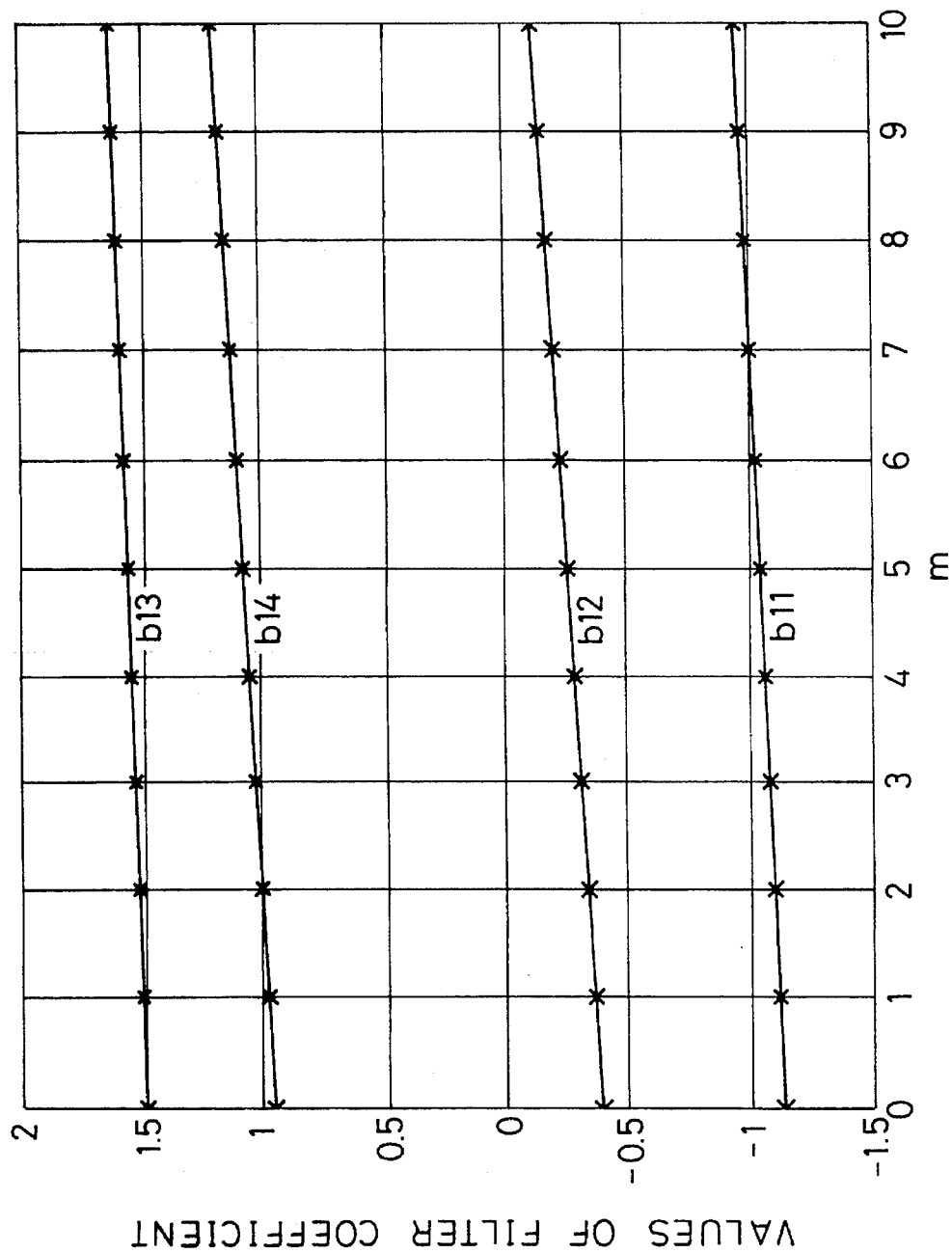
Figure 6:
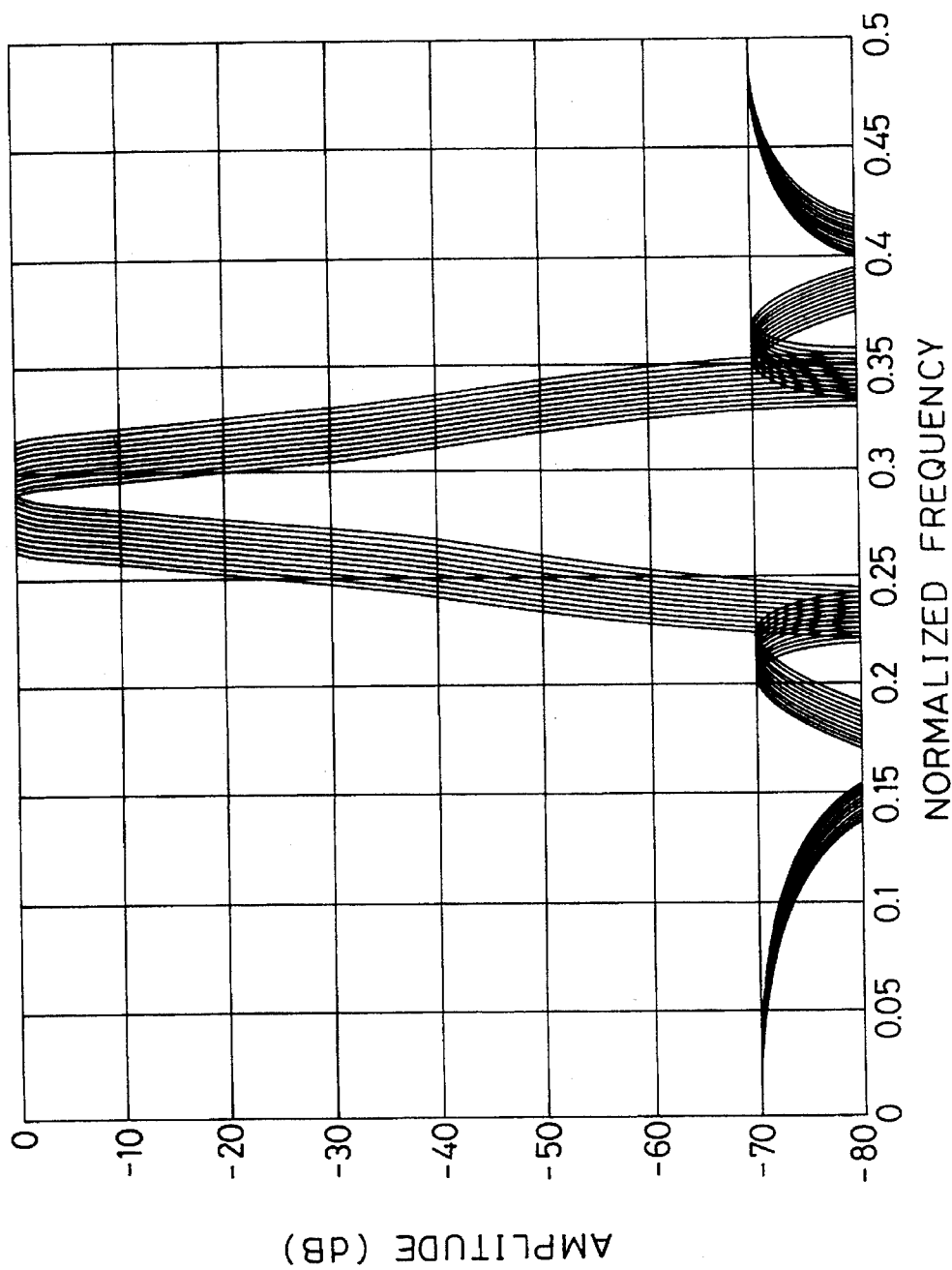
FIG. 6 is a graph exemplifying a change in the center frequency of the pass band of the digital filter system according to the first embodiment of this invention.

FIGS. 3 through 5 show the relationships between the thus obtained individual filter coefficients and the shift amount $m\Delta f$, and FIG. 6 shows an example of the characteristic of the digital band pass elliptic filter system.

In FIG. 6, the center frequency changes with a fixed band width. Namely, the digital band pass elliptic filter system of this example has a fixed normalized band width of 0.025 and a variable center frequency.

According to this embodiment, as described above, for an eight-order IIR digital band pass elliptic filter, for example, new filter coefficients can be obtained through 12 multiplications by the multiplier 17 and 12 additions by the adder 19. This embodiment can therefore change the center frequency with a smaller amount of computation as compared with the prior art. The fewer calculations result in fewer computation errors. As the first and second memories 13 and 15 merely store 24 pieces of data, they can have a small capacity.

Figure 7:
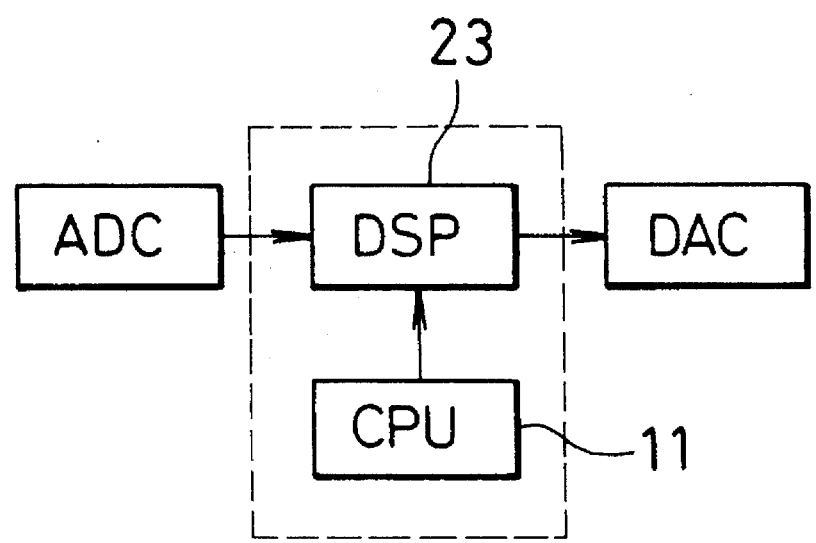
FIG. 7 is a block diagram showing a modification of the structure of the digital filter system embodying the present invention.

Although the foregoing description has been given with reference to the case where the first and second memories 13 and 15, the multiplier 17, the adder 19 and the digital band pass elliptic filter 21 are constituted of separate hardware, those components may be constituted of an ordinary DSP (Digital Signal Processor) as shown in FIG. 7.

Although the foregoing description has explained that the CPU 11 outputs the difference $m\Delta f$ between the center frequency $f_a$ of one (FA) of the two known digital band pass elliptic filters FA and FB (reference center frequency) and the desired center frequency f, the CPU 11 may output the desired center frequency f and another circuit may compute the difference $m\Delta f$ between the desired center frequency and the reference center frequency $f_a$ and supply the difference to the multiplier 17.

Second Embodiment

The foregoing description of the first embodiment has explained that the center frequency is changed without altering the pass band width. However, this invention is also applicable to an N-order IIR digital band pass elliptic filter system which can change the pass band width (the width of the pass band) without changing the center frequency. The following describes such an IIR digital band pass elliptic filter system which can change the pass band width as a second embodiment.

Given that the center frequency of the band pass is constant, the individual filter coefficients $a_{1i}$, $a_{2i}$ and $b_{1i}$ in the equation (6) approximately become linear functions of a pass band width B.

Thus, the transfer function in the equation (6) can be rewritten as an equation (17).

$$H(\omega) = \prod_{i=1}^{N/2} \frac{1 + b_{1i}(B_0)e^{-j\omega t} + e^{-2j\omega t}}{1 + \alpha_{1i}(B_0)e^{-j\omega t} + \alpha_{2i}(B_0)e^{-2j\omega t}} \quad (17)$$

where $B_0$ is the normalized pass band width, i.e., the pass band width with the sampling frequency of the input digital signal taken as "1," and $a_{1i}(B_0)$, $a_{2i}(B_0)$ and $b_{1i}(B_0)$ indicate that the filter coefficients $a_{1i}$, $a_{2i}$ and $b_{1i}$ are linear functions of the pass band width $B_0$.

If the center frequency of this digital filter is $f_c$ and the pass band width $B_0$ changes from $B_1$ to $B_2$, $0 < B_1 < B_2 < 0.5$, $0 < f_c - B_2/2$, and $f_c + B_2/2 < 0.5$ are satisfied.

As the filter coefficients $a_{1i}$, $a_{2i}$ and $b_{1i}$ are linear functions of the normalized pass band width $B_0$, the values of those filter coefficients change in accordance with the amount of a change, $m\Delta B$, in normalized pass band width $B_0$. Therefore, if the amount of a change in each filter coefficient with respect to a unit amount of a change $\Delta B$ of the normalized pass band width, i.e., the slope of the linear function of each filter coefficient, is obtained previously and the slope is multiplied by the amount of a change in pass band width, $m\Delta B$, it is possible to acquire the amount of a change in each filter coefficient for changing the pass band width. By adding the acquired change amount of each filter coefficient to the reference filter coefficient, filter coefficients necessary for attaining that pass band width can be obtained.

According to the second embodiment, therefore, the slope of the linear equation of each filter coefficient is obtained using the filter coefficients of two known digital filters which have the same center frequency but different pass band widths. For example, provided that the two filters respectively having the pass band widths $B_a$ and $B_b$ have filter coefficients $\{a_{1i}(B_a), a_{2i}(B_a), b_{1i}(B_a)\}$ and $\{a_{1i}(B_b), a_{2i}(B_b), b_{1i}(B_b)\}$, the slopes of the linear equations can be obtained from equations (18) to (20).

$$k_{a1i}=[a_{1i}(B_b)-a_{1i}(B_a)]/(B_b-B_a) \quad (18)$$

i=1, 2, ..., N/2

$$k_{a2i}=[a_{2i}(B_b)-a_{2i}(B_a)]/(B_b-B_a) \quad (19)$$

i=1, 2, ..., N/2

$$k_{b1i}=[b_{1i}(B_b)-b_{1i}(B_a)]/(B_b-B_a) \quad (20)$$

i=1, 2, ..., N/2

The linear equations of the individual filter coefficients are obtained from equations (21) to (23) using the acquired slopes and the filter coefficients of another arbitrary known digital filter, which has the same center frequency as the aforementioned two known digital filters and has a pass band width $B_r$.

$$a_{1i}(B)=k_{a1i}\cdot(B-B_r)+a_{1i}(B_r) \quad (21)$$

$$a_{2i}(B)=k_{a2i}\cdot(B-B_r)+a_{2i}(B_r) \quad (22)$$

$$b_{1i}(B)=k_{b1i}\cdot(B-B_r)+b_{1i}(B_r) \quad (23)$$

where B is the normalized pass band width of the digital filter to be obtained. By setting the obtained filter coefficients in the digital filter, the digital band pass elliptic filter, which has the same center frequency as that of the known digital filters and the normalized pass band width B.

If the pass band width $B_r$ is set equal to the aforementioned pass band width $B_a$ or $B_b$, for example, the filter coefficients used in the equation (18) to (20) can also be used.

The specific structure and operation of this digital band pass elliptic filter system will now be described.

The structure is the same as that of the first embodiment shown in FIG. 2.

In this embodiment, the knob SV is used to input an instruction to widen or narrow the pass band width. The CPU 11 controls the general operation of this digital filter system and supplies the difference mΔB between the desired pass band width B and the reference pass band width $B_a$ to the multiplier 17 in accordance with the manipulation of the knob SV.

The first memory 13 stores the filter coefficients $\{a_{1i}(B_a), a_{2i}(B_a), b_{1i}(B_a)\}$ of the aforementioned arbitrary known digital filters.

The second memory 15 stores slopes $k_{a1i}$, $k_{a2i}$ and $k_{b1i}$ (i=1, 2, ..., N/2), which have been computed in advance.

The multiplier 17 obtains the difference mΔB output from the CPU 11 and the slopes $k_{a1i}$, $k_{a2i}$ and $k_{b1i}$ stored in the second memory 15, $k_{a1i}\cdot m\Delta B$, $k_{a2i}\cdot m\Delta B$ and $k_{b1i}\cdot m\Delta B$, i.e., the change amounts of the filter coefficients due to a variation in pass band width.

The adder 19 adds each of the filter coefficients $a_{1i}(B_a)$, $a_{2i}(B_a)$, $b_{1i}(B_a)$ stored in the first memory 13, to an associated one of the multiplication results from the multiplier 17, $k_{a1i}\cdot m\Delta B$, $k_{a2i}\cdot m\Delta B$ and $k_{b1i}\cdot m\Delta B$, to attain new filter coefficients.

The digital band pass elliptic filter 21 filters the input digital signal in accordance with the filter coefficients supplied from the adder 19.

In this manner, the IIR digital band pass elliptic filter which can change the pass band width as needed is obtained.

The first and second memories 13 and 15, the multiplier 17, the adder 19 and the digital band pass elliptic filter 21 may be constituted of a digital signal processor (DSP) as shown in FIG. 7.

A specific description will now be given of an example of designing an eight-order digital band pass elliptic filter which has a normalized center frequency of 0.25 with a unit change amount of the pass band width being 0.001.

Assume that the filter coefficients and pass band widths of known band pass digital filters FC and FD having a normalized center frequency of 0.25 take the following values.

For band pass digital filter FC,
normalized pass band width $B_c$=0.016

$a_{11}$=0.1113, $a_{12}$=−0.113, $a_{13}$=0.0466, $a_{14}$=−0.0466, $a_{21}$=0.9748, $a_{22}$=0.9748, $a_{23}$=0.9372, $a_{24}$=0.9372, $b_{11}$=1.0208, $b_{12}$=−1.0208, $b_{13}$=0.4819, $b_{14}$=−0.4819.

For band pass digital filter FD, normalized pass band width $B_d$=0.018

$a_{11}$=0.1250, $a_{12}$=−0.1250, $a_{13}$=0.0522, $a_{14}$=−0.0522, $a_{21}$=0.9717, $a_{22}$=0.9717, $a_{23}$=0.9297, $a_{24}$=0.9297, $b_{11}$=1.1077, $b_{12}$=−1.1077, $b_{13}$=0.5351, $b_{14}$=−0.5351.

In this case, the first memory 13 stores the individual filter coefficients of one of the band pass digital filters FC and FD, e.g., those of the filter FC.

The slopes of the linear functions of the individual filter coefficients are expressed as follows.

$$k_{a1i}=[a_{1i}(B_d)-a_{1i}(B_c)]/(B_d-B_c)$$

$$k_{a2i}=[a_{2i}(B_d)-a_{2i}(B_c)]/(B_d-B_c)$$

$$k_{b1i}=[b_{1i}(B_d)-b_{1i}(B_c)]/(B_d-B_c)$$

$$B_d-B_c=0.002$$

The individual slopes take the following values.

$k_{a11}$=6.8500, $k_{a12}$=−6.8500, $k_{a13}$=2.8000, $k_{a14}$=−2.8000, $k_{a21}$=−1.5500, $k_{a22}$=−1.5500, $k_{a23}$=−3.7500, $k_{a24}$=−3.7500, $k_{b11}$=43.4500, $k_{b12}$=−43.4500, $k_{b13}$=26.6000, $k_{b14}$=−26.6000.

Those values are stored in the second memory 15.

When the CPU 11 outputs the difference mΔB (=B−$B_c$ =B−0.016) between the reference pass band width $B_c$ and the desired pass band width B indicated by the shift knob SV, the multiplier 17 obtains the product of each slope and the frequency difference mΔB.

$k_{a11}\cdot m\Delta B$=6.8500·mΔB, $k_{a12}\cdot m\Delta B$=−6.8500·mΔB, $k_{a13}\cdot m\Delta B$=2.8000·mΔB, $k_{a14}\cdot m\Delta B$=−2.8000·mΔB, $k_{a21}\cdot m\Delta B$=−1.5500·mΔB, $k_{a22}\cdot m\Delta B$=−1.5500·mΔB, $k_{a23}\cdot m\Delta B$=−3.7500·mΔB, $k_{a24}\cdot m\Delta B$=−3.7500·mΔB, $k_{b11}\cdot m\Delta B$=43.4500·mΔB, $k_{b12}\cdot m\Delta B$=−43.4500·mΔB, $k_{b13}\cdot m\Delta B$=26.6000·mΔB, $k_{b14}\cdot m\Delta B$=−26.6000·mΔB.

Upon reception of the multiplication results from the multiplier 17, the adder 19 adds each of the filter coefficients stored in the first memory 13 to an associated one of the received products to yield new filter coefficients.

$a_{11}'=k_{a11} \cdot m\Delta B+a_{11}(B_c)=6.8500 \cdot m\Delta B+0.1113,$ $a_{12}'=k_{a12} \cdot m\Delta B+a_{12}(B_c)=-6.8500 \cdot m\Delta f-0.1113,$ $a_{13}'=k_{a13} \cdot m\Delta B+a_{13}(B_c)=2.8000 \cdot m\Delta f+0.0466,$ $a_{14}'=k_{a14} \cdot m\Delta B+a_{13}(B_c)=-2.8000 \cdot m\Delta f-0.0466,$ $a_{21}'=k_{a21} \cdot m\Delta B+a_{21}(B_c)=-1.5500 \cdot m\Delta f+0.9748,$ $a_{22}'=k_{a22} \cdot m\Delta B+a_{22}(B_c)=-1.5500 \cdot m\Delta f+0.9748,$ $a_{23}'=k_{a23} \cdot m\Delta B+a_{23}(B_c)=-3.7500 \cdot m\Delta f+0.9372,$ $a_{24}'=k_{a24} \cdot m\Delta B+a_{24}(B_c)=-3.7500 \cdot m\Delta f+0.9372,$ $b_{11}'=k_{b11} \cdot m\Delta B+b_{11}(B_c)=43.4500 \cdot m\Delta f+1.0208,$ $b_{12}'=k_{b12} \cdot m\Delta B+b_{12}(B_c)=-43.4500 \cdot m\Delta f+1.0208,$ $b_{13}'=k_{b13} \cdot m\Delta B+b_{13}(B_c)=26.6000 \cdot m\Delta f+0.4819,$ $b_{14}'=k_{b14} \cdot m\Delta B+b_{14}(B_c)=-26.6000 \cdot m\Delta f+0.4819.$ The digital band pass elliptic filter 21 receives the filter coefficients $a_{11}'$, $a_{12}'$, $a_{13}'$, $a_{14}'$, $a_{21}'$, $a_{22}'$, $a_{23}'$, $a_{24}'$, $b_{11}'$, $b_{12}'$, $b_{13}'$, and $b_{14}'$ from the adder 19, filters the input digital signal in accordance with the received filter coefficients and outputs the filtered digital signal.

Figure 8:
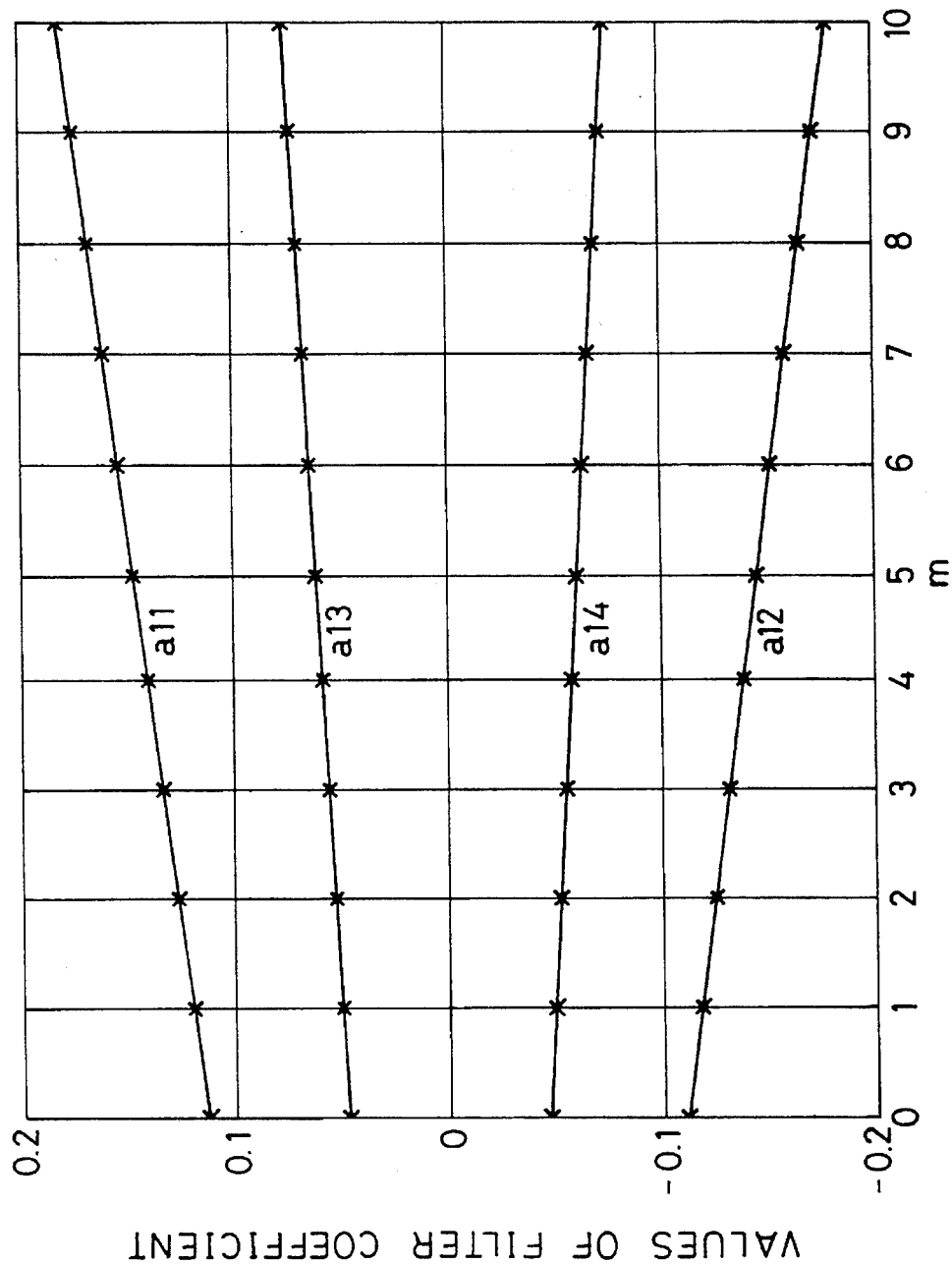
FIGS. 8 to 10 are graphs of linear functions of filter coefficients of a digital filter system according to a second embodiment of this invention.
Figure 9:
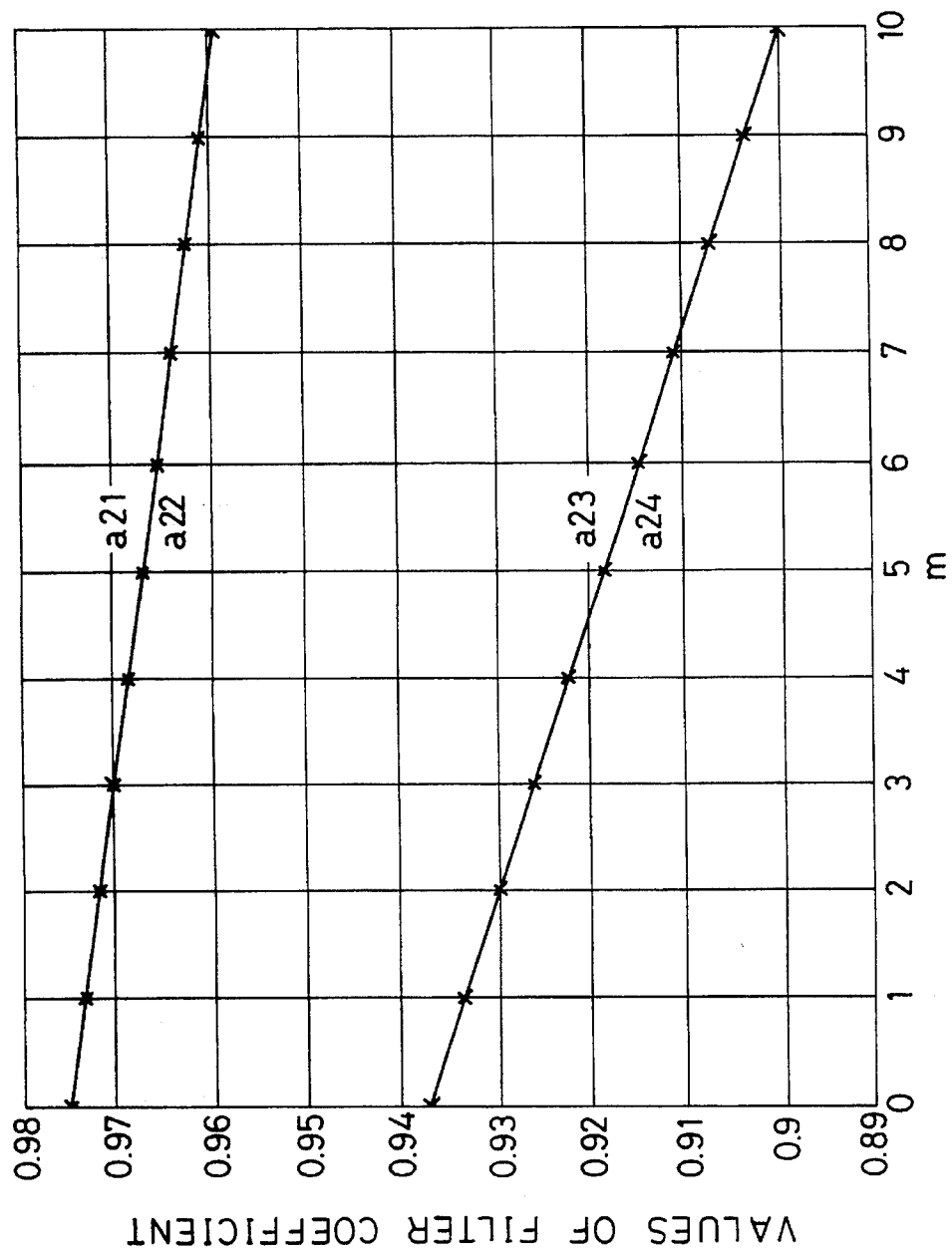
Figure 10:
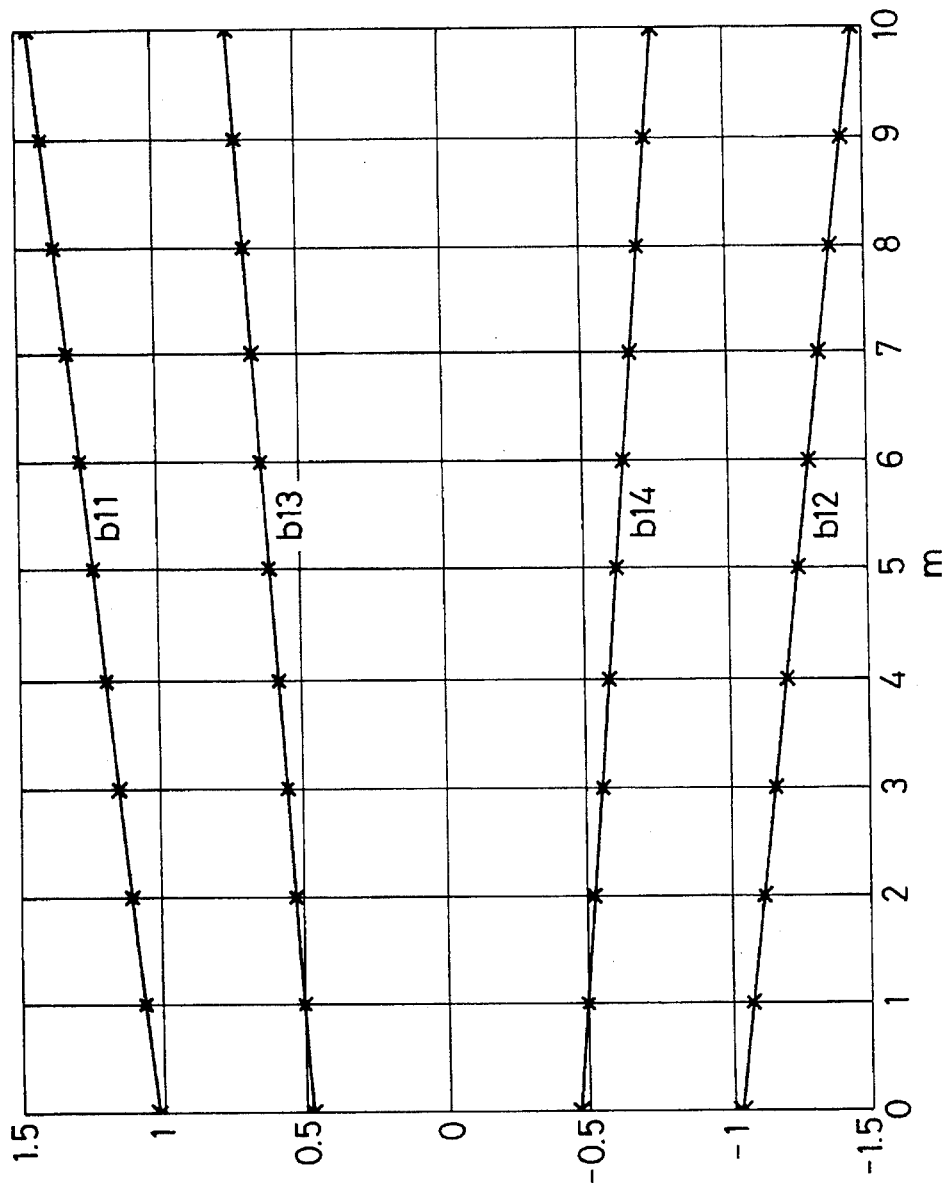
Figure 11:
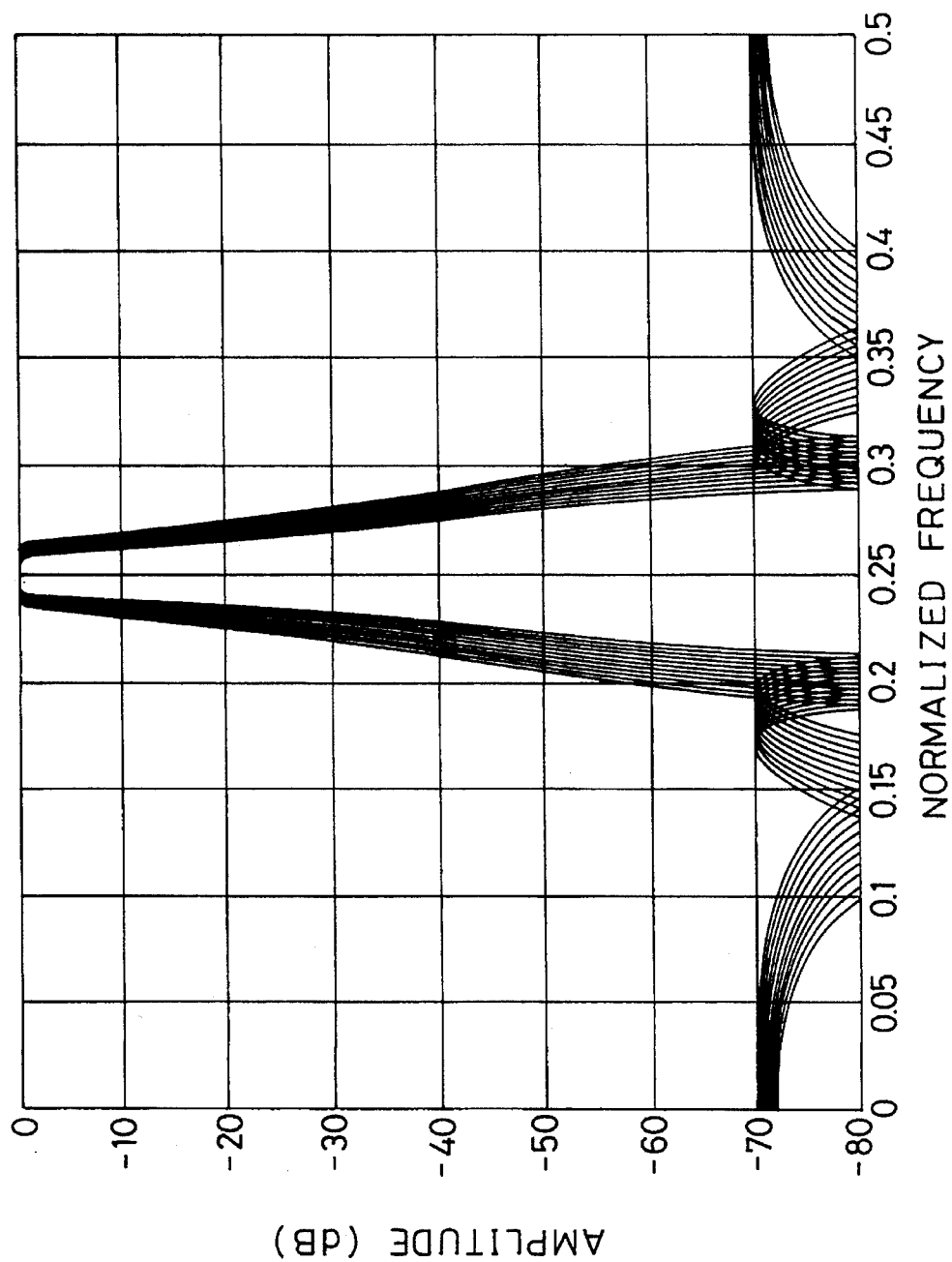
FIG. 11 is a graph exemplifying a change in the width of the pass band of the digital filter system according to the second embodiment of this invention.

FIGS. 8 through 10 show the relationships between the thus obtained individual filter coefficients and the shift amount $m\Delta B$, and FIG. 11 shows an example of the characteristic of the digital band pass elliptic filter system.

As can be understood from FIG. 11, the digital band pass elliptic filter system of this example has the fixed normalized center frequency of 0.25 and variable pass band width.

According to the second embodiment, as described above, for an eight-order digital band pass elliptic filter, for example, new filter coefficients can be obtained through 12 multiplications by the multiplier 17 and 12 additions by the adder 19, thus allowing the pass band width to be changed with a smaller amount of computation as compared with the prior art. The fewer calculations result in fewer computation errors. As the first and second memories 13 and 15 merely store 24 pieces of data, they can have a small capacity.

Although the foregoing description has been given with reference to the case where the first and second memories 13 and 15, the multiplier 17, the adder 19 and the digital band pass elliptic filter 21 are constituted of separate components, those components may be constituted of an ordinary DSP and a CPU which gives necessary instructions to the DSP, as shown in FIG. 7.

Although the foregoing description has explained that the CPU 11 outputs the difference $m\Delta B$ between the pass band width $B_a$ of one of the two known digital filters (reference pass band width) and the desired pass band width B, the CPU 11 may output the desired pass band width B and another circuit may compute the difference $m\Delta B$ between the desired pass band width B and the reference pass band width $B_a$ and supply the difference to the multiplier 17.

The pass band width is fixed in the first embodiment, whereas the center frequency is fixed in the second embodiment. This invention can however change the center frequency and pass band width simultaneously.

In this case, the filter coefficients of two known digital filters should be prepared for each combination of the pass band width and center frequency, the slopes should be computed and stored in the second memory 15 for each combination of the pass band width and center frequency, and the reference filter coefficient should be stored in the first memory 13 for each combination of the pass band width and center frequency. The proper slope and filter coefficients are read in accordance with the combination of the center frequency and pass band width output from the CPU 11, and new filter coefficients are obtained based on those read data to set the desired digital filter.

The present invention is not limited to the above-described embodiments, but may be modified and applied in various other forms and manners.

In short, according to the present invention, the filter coefficients for obtaining the desired center frequency and desired pass band width can be acquired with a smaller memory capacity and fewer computations, and the desired center frequency and pass band width can be obtained relatively easily based on the acquired filter coefficients.

What is claimed is:

1. A center-frequency variable type digital band pass elliptic filter system comprising:

an N-order digital band pass elliptic filter for filtering an input digital signal in accordance with filter coefficients $\{a_{1i}, a_{2i}, b_{1i}\}$ (i=1, 2, . . . , N/2; N being an even);

memory means for storing linear coefficients $k_{aji}$ and $k_{b1i}$ computed according to following equations, using filter coefficients $\{a_{1i}(f_a), a_{2i}(f_a), b_{1i}(f_a)\}$ and $\{a_{1i}(f_b), a_{2i}(f_b), b_{1i}(f_b)\}$ of first and second known digital band pass elliptic filters having a same pass band width and the pass band center frequencies $f_a$ and $f_b$, and for storing filter coefficients $\{a_{1i}(f_r), a_{2i}(f_r), b_{1i}(f_r)\}$ of a third known digital band pass elliptic filter having the same pass band width as that of said first and second known digital band pass elliptic filters and a pass band center frequency fr, $k_{aji}=\{a_{ji}(f_b)-a_{ji}(f_a)\}/(f_b-f_a)$ i=1, 2, . . . , N/2, j=1, 2

$k_{b1i}=\{b_{1i}(f_b)-b_{1i}(f_a)\}/(f_b-f_a)$ i=1, 2, . . . , N/2;

shift-amount setting means for setting a shift amount $m\Delta f$ between a desired center frequency of said N-order digital band pass elliptic filter and a predetermined center frequency $f_r$;

multiplying means for multiplying said shift amount $m\Delta f$, supplied from said shift-amount setting means, by each of said linear coefficients $K_{aji}$ and $k_{b1i}$ to yield $m\Delta f \cdot k_{aji}$ and $m\Delta f \cdot k_{b1i}$;

adding means for adding each of products obtained by said multiplying means to an associated one of said filter coefficients stored in said memory means to obtain $a_{1i}(f_r)+m\Delta f \cdot k_{a1i}$, $a_{2i}(f_r)+m\Delta f \cdot k_{a2i}$ and $b_{1i}(f_r)+m\Delta f \cdot k_{b1i}$; and setting means for setting values $a_{1i}(f_r)+m\Delta f \cdot k_{a1i}$, $a_{2i}(f_r)+m\Delta f \cdot k_{a2i}$ and $b_{1i}(f_r)+m\Delta f \cdot k_{b1i}$ obtained by said adding means as said filter coefficients $\{a_{1i}, a_{2i}, b_{1i}\}$ of said N-order digital band pass elliptic filter, thereby setting a center frequency of said N-order digital band pass elliptic filter to $f_r+m\Delta f$.

2. A center-frequency variable type digital band pass filter system comprising:

a digital band pass filter for filtering an input digital signal in accordance with set filter coefficients;

memory means for storing values indicating change amounts of said filter coefficients with respect to a unit change in a pass band center frequency of said band pass digital filter, and filter coefficients of said band pass digital filter with respect to a predetermined center frequency;

difference setting means for setting a difference between a desired center frequency of said band pass digital filter and said predetermined center frequency;

multiplying means for multiplying said difference, set by said difference setting means, by each of said values indicating said change amounts;

adding means for adding each of results of multiplication by said multiplying means to an associated one of said filter coefficients with respect to said predetermined center frequency; and filter coefficient setting means for setting results of addition by said adding means as new filter coefficients of said band pass digital filter.

* * * * *

UNITED STATES PATENT AND TRADEMARK OFFICE
CERTIFICATE OF CORRECTION

PATENT NO. : 5,479,362
DATED : December 26, 1995
INVENTOR(S) : SUN et al.

It is certified that error appears in the above-indentified patent and that said Letters Patent is hereby corrected as shown below:

Column 1, lines 40-45, in equation (3) please space the denominator portion of the equation further below the division line so that the square function "2" does not overlap with the division line.

Column 2, line 46, change "$m\Delta f.k_{aji}$" to --$m\Delta f \cdot k_{aji}$--;
line 47, change "$m\Delta f.k_{b1i}$" to -- $m\Delta f \cdot k_{b1i}$"--;
line 51, delete:
"$a_{1i}(f_r)\ m\Delta f.k_{a1i},\ a_{2i}(f_r)+m\Delta f.k_{a2i}$ and $b_{1i}(f_r)+m\Delta f.k_{b1i}$;"
and insert:
--$a_{1i}(f_r)+m\Delta f \cdot k_{a1i},\ a_{2i}(f_r)+m\Delta f \cdot k_{a2i}$ and $b_{1i}(f_r)+m\Delta f \cdot k_{b1i}$;
line 53, change "$m\Delta f.k_{a1i}$" to --$m\Delta f \cdot k_{a1i}$--;
line 54, change "$m\Delta f.k_{a2i}$" to --$m\Delta f \cdot k_{a2i}$--; and change "$m\Delta f.k_{b1i}$" to --$m\Delta f \cdot k_{b1i}$--.

UNITED STATES PATENT AND TRADEMARK OFFICE
CERTIFICATE OF CORRECTION

PATENT NO. : 5,479,362
DATED : December 26, 1995
INVENTOR(S) : SUN et al.

It is certified that error appears in the above-indentified patent and that said Letters Patent is hereby corrected as shown below:

Column 3, line 25, change "$m\Delta B.k_{aji}$" to --$m\Delta B \cdot k_{aji}$--;

line 26, change "$m\Delta B.k_{b1i}$" to --$m\Delta B \cdot k_{b1i}$--;

line 30, change $m\Delta B.k_{a1i}$" to --$m\Delta B \cdot k_{a1i}$--; and change "$m\Delta B.k_{a2i}$" to --$m\Delta B \cdot k_{a2i}$--;

line 31, change "$m\Delta B.k_{b1i}$" to --$m\Delta B \cdot k_{b1i}$--;

line 32, change "$m\Delta B.k_{a1i}$" to --$m\Delta B \cdot k_{a1i}$--;

line 33, $m\Delta B.k_{a2i}$" to --$m\Delta B \cdot k_{a2i}$--; change "$m\Delta B.k_{b1i}$" to --$m\Delta B \cdot k_{b1i}$--;

Column 6, line 21, after "filter" insert --21--.

Column 11, line 16 (the line beginning with $b_{12}'$), before "1.0208" change the "+" to -----;

line 20 (the line beginning with $b_{14}'$), before "0.4819" change "+" to -----.

Signed and Sealed this

Twenty-fourth Day of December, 1996

Attest:

BRUCE LEHMAN

Attesting Officer

Commissioner of Patents and Trademarks